United States Patent [19]

Cottatellucci

[11] 4,355,288

[45] Oct. 19, 1982

[54] FREQUENCY-STABILIZING SYSTEM FOR GENERATOR OF MICROWAVE OSCILLATIONS

[75] Inventor: Ezio Cottatellucci, Milan, Italy

[73] Assignee: Societa Italiana Telecomunicazioni Siemens S.P.A., Milan, Italy

[21] Appl. No.: 142,681

[22] Filed: Apr. 22, 1980

Related U.S. Application Data

[63] Continuation-in-part of Ser. No. 16,530, Mar. 1, 1979, abandoned.

[30] Foreign Application Priority Data

Mar. 7, 1978 [IT] Italy ................................ 20925 A/78

[51] Int. Cl.³ ............................................... H03L 7/08
[52] U.S. Cl. .......................................... 331/12; 331/14; 331/17; 331/26; 332/19
[58] Field of Search ...................... 331/1 A, 11, 12, 18, 331/25, 34, 5, 6, 14, 17, 27, 26; 332/19, 30 V

[56] References Cited

U.S. PATENT DOCUMENTS

| | | | |
|---|---|---|---|
| 3,321,712 | 5/1967 | Frisch et al. | 331/17 X |
| 3,456,196 | 7/1969 | Schneider | 331/12 X |
| 3,789,316 | 1/1974 | Goetz et al. | 331/12 |
| 3,886,472 | 5/1975 | Cottatellucci | 331/12 |
| 4,156,204 | 5/1979 | Hargis | 331/12 |

*Primary Examiner*—Siegfried H. Grimm
*Attorney, Agent, or Firm*—Karl F. Ross

[57] ABSTRACT

A carrier oscillation in the microwave range is stabilized by a sequence of timing pulses produced by a crystal-controlled reference oscillator whose cadence is an aliquot fraction of the nominal carrier frequency. The pulses are used to obtain two phase-representing amplitude samples of the carrier wave from a pair of mutually phase-shifted pilot oscillations of the same frequency in each of a succession of nonconsecutive cycles thereof; a control voltage derived from these amplitude samples is fed back to the microwave oscillator via a frequency-correcting or phase-locking loop.

7 Claims, 5 Drawing Figures

FREQUENCY-STABILIZING SYSTEM FOR GENERATOR OF MICROWAVE OSCILLATIONS

CROSS-REFERENCE TO RELATED APPLICATION

This is a continuation-in-part of my copending U.S. patent application Ser. No. 16,530, filed Mar. 1, 1979 and now abandoned.

FIELD OF THE INVENTION

My present invention relates to radio-frequency generation and, more particularly, to a system for stabilizing the operating frequency of a voltage-controlled microwave oscillator which generates a carrier frequency for a radio link.

BACKGROUND OF THE INVENTION

In a microwave radio link, a local oscillator, generally of the transistor or diode type, generates radio-frequency signals of a predetermined power level and is usually frequency-stabilized by synchronization with a crystal-controlled reference oscillator. Conventional stabilization methods include phase coupling or automatic frequency control by means of a zero-frequency discriminator, as described in my prior U.S. Pat. No. 3,886,472. Such methods require the comparison of two waveforms of approximately the same frequency. Because radio links employ frequencies in the range of 2,000 to 13,000 MHz and because present crystal-controlled oscillators are capable of producing frequencies up to about 100 MHz, it is necessary to provide a chain of multiplication or division stages for stepping up the frequency of the stabilized oscillations or for stepping down the frequency of the microwave. Such chains are rather expensive and contribute to increasing the physical dimensions of the system. These disadvantages are aggravated by the fact that the various r-f bands require different multiplication or division factors; thus, several tens of separate chains of multiplier or divider stages are required for spanning the range of 1,800 to 8,500 MHz generally used for the various carriers in radio links. Furthermore, because division circuits have relatively narrow pass bands, it is often necessary to make more than one such circuit available for a given frequency band of 500 to 700 MHz, for example.

OBJECTS OF THE INVENTION

An important object of my present invention is to provide a simple and inexpensive system for stabilizing the frequency of a microwave oscillator.

A more particular object is to provide a system of this type adapted to be used for the control of a large number of oscillators with operating frequencies, preferably in the gigahertz range, that are multiples of a common subharmonic.

SUMMARY OF THE INVENTION

A system for producing a microwave oscillation of stabilized frequency comprises, according to my present invention, a reference generator emitting a sequence of timing pulses of constant cadence $f_r$ and a voltage-controlled oscillator generating the microwave oscillation to be stabilized, the oscillator having an operating frequency $f_s$ deviating in a free-running state by less than $f_r/2$ from a nominal frequency equal to $K \cdot f_r$ where $K$ is an integer greater than 1. Phase-comparing circuitry connected to the oscillator derives a pair of instantaneous amplitude samples of predetermined phase relationship from the microwave oscillation in nonconsecutive cycles thereof and extracts two low-frequency error signals from changes in the magnitudes of successive pairs of amplitude samples thus derived. A deviation detector connected to this circuitry converts differences between the error signals into a control voltage fed to the oscillator for modifying the operating frequency $f_s$.

According to another feature of my present invention, the phase-comparing circuitry comprises a coupler deriving a pair of relatively phase-shifted pilot oscillations of frequency $f_s$ from the microwave oscillation, and a sampling circuit connected to the coupler and to the reference generator for superimposing the pilot oscillations upon two sawtooth voltages obtained from the timing pulses.

According to a more particular feature of my present invention, the sampling circuit includes a pair of resistors connected across respective outputs of the coupler, each of the resistors being further connected across an output of the reference generator in series with a respective blocking capacitor and a respective diode.

Pursuant to yet another feature of my present invention, the reference generator comprises a crystal-controlled oscillator operating at a frequency close to 100 MHz and a frequency doubler coupled to this oscillator for establishing the reference cadence $f_r$ at a value close to 200 MHz.

For coarse tuning by a frequency-correcting loop, the phase difference between the pilot oscillations is 90° and the deviation detector comprises a zero-frequency discriminator preferably including a differential amplifier with a response threshold sufficient for limited frequency modulation of the carrier by a message signal fed to the microwave oscillator. For fine tuning by a phase-locking loop, with a deviation detector consisting mainly of a differential amplifier, the two pilot oscillations are in phase opposition.

BRIEF DESCRIPTION OF THE DRAWING

These and other features of my present invention will now be described in detail, reference being made to the accompanying drawing in which.

SPECIFIC DESCRIPTION

Figure 1:
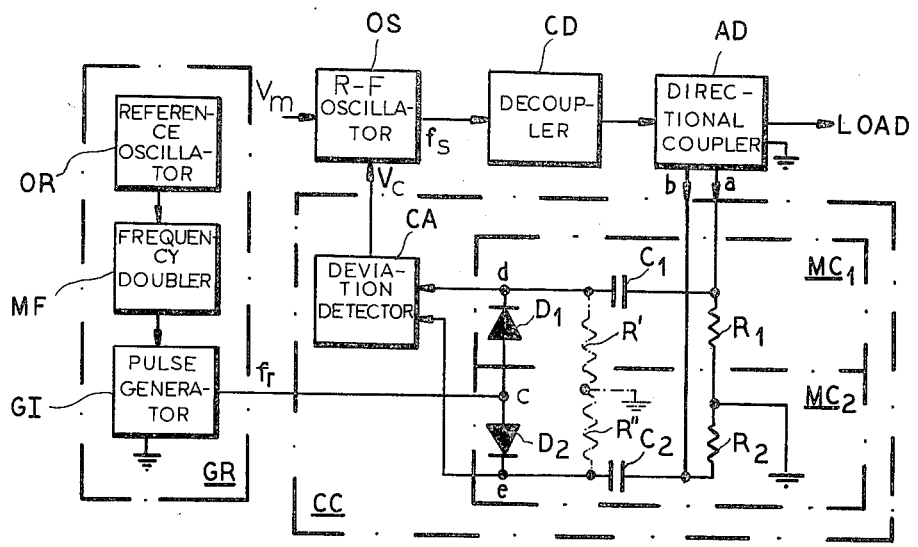
FIG. 1 is a block diagram of a system according to my invention for stabilizing the operating frequency of a microwave oscillator.

As shown in FIG. 1, a system for stabilizing a waveform of radio frequency $f_s$ emitted by a microwave oscillator OS includes a reference-signal generator GR for feeding a train of timing pulses of repetition frequency $f_r$ to the output of a sampling and comparison circuit CC connected to oscillator OS via a decoupler CD and a preferably unidirectional coupler AD. An input of oscillator OS is tied to circuit CC for receiving a control signal $V_c$ to maintain frequency $f_s$ at or close to a nominal frequency equal to an integral multiple $K \cdot f_r$ of pulse cadence $f_r$. It is assumed that in its free-running state oscillator OS has a frequency drift less than $f_r/2$.

Circuit GR comprises a crystal-controlled oscillator OR for generating a highly stable reference frequency between 90 and 100 MHz, a frequency doubler MF, and a pulse generator GI, preferably including a diode of the step-recovery type, for emitting the pulse train $f_r$ with a cadence equal to twice the reference frequency, i.e. between 180 and 200 MHz, it being assumed that the maximum frequency drift of oscillator OS is less than 90 to 100 MHz. Decoupler CD is a circulator having microwave-guide junctions for transmitting carrier wave $f_s$ to a load via directional coupler AD and for shunting reverse signals, such as reflections coming from coupler AD, to ground. Similarly, coupler AD blocks the transmission of return signals from circuit CC while emitting, at a pair of outputs a, b, two pilot oscillations of frequency $f_s$ and differing in phase by 90° or 180°, depending on whether coarse or fine tuning of the oscillator OS is desired. With coarse tuning, the carrier $f_s$ could be subjected to a certain amount of frequency modulation (taken into account in determining the maximum frequency drift) by a message signal $V_m$.

Sampling and comparison circuit CC comprises two branches with mixers $MC_1$, $MC_2$ respectively receiving the pilot oscillations from outputs a, b of coupler AD for detecting their phases at successive instants determined by the pulses of train $f_r$. Mixers $MC_1$, $MC_2$ include respective diodes $D_1$, $D_2$ having anodes linked via a junction or node c to generator GI and cathodes connected at respective junctions d, e to a pair of blocking capacitors $C_1$, $C_2$ in series with respective resistors $R_1$, $R_2$ which lie between ground and the outputs a, b of coupler AD. Mixers $MC_1$, $MC_2$ have outputs extending from nodes d, e to a deviation detector CA which produces therefrom the control voltage $V_c$ fed to the frequency-stabilizing input of oscillator OS.

Figure 2:
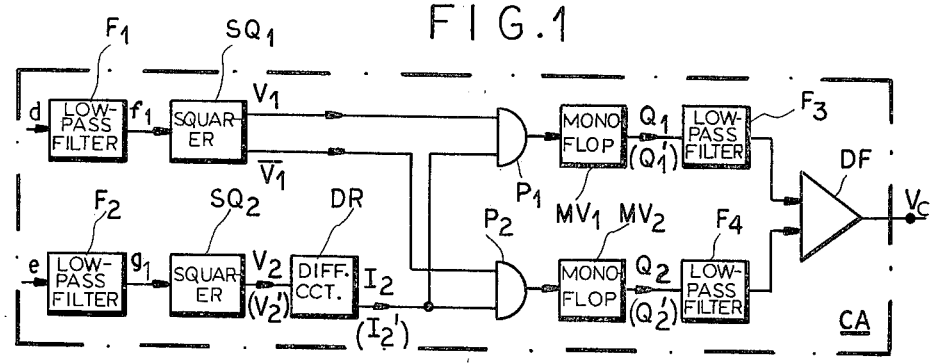
FIG. 2 is a block diagram of a zero-frequency discriminator shown in FIG. 1.
Figure 4A:
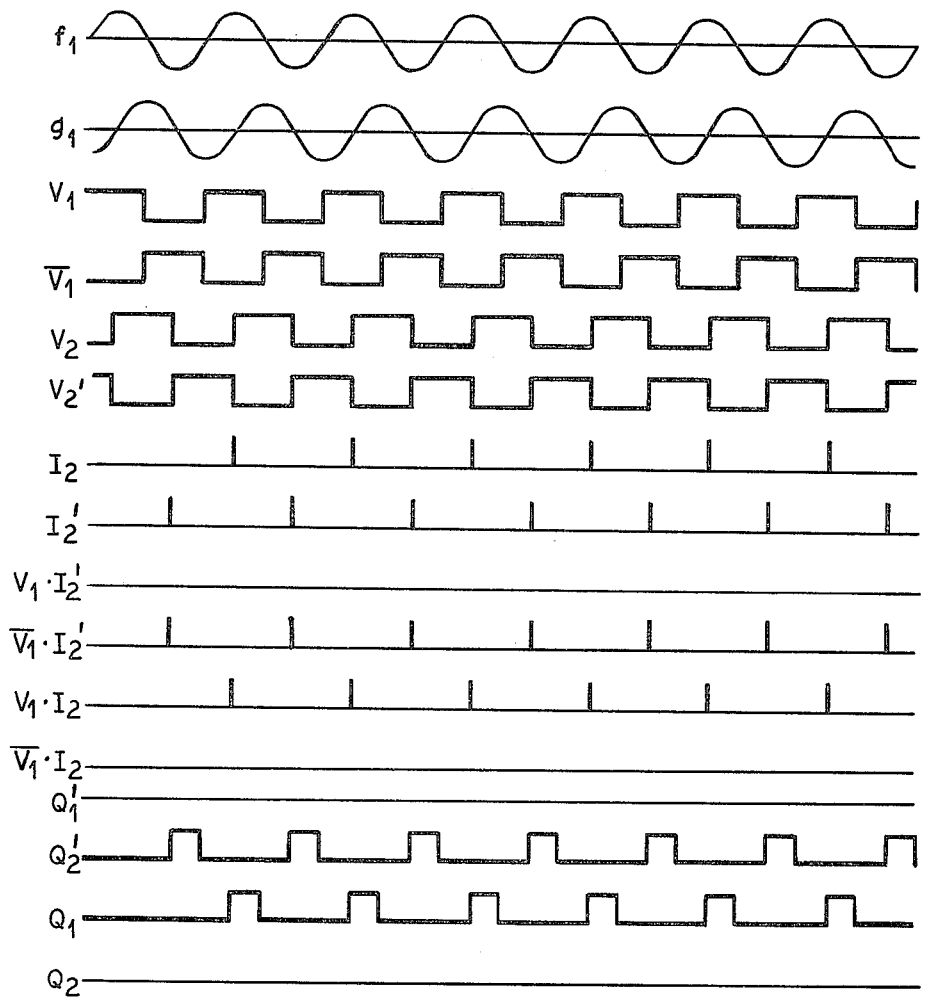
FIG. 4A is a set of graphs, on a time scale different from that of FIG. 3, of voltage levels present in the discriminator of FIG. 2.

When the two pilot oscillations are in quadrature, deviation detector CA may comprise a zero-frequency discriminator similar to that disclosed in my prior U.S. Pat. No. 3,886,472 referred to above. Such a discriminator, as shown in FIG. 2, includes a pair of low-pass filters $F_1$, $F_2$ connected to terminals d, e of mixers $MC_1$, $MC_2$ and supplying respective clipping or squaring circuits $SQ_1$, $SQ_2$ with substantially sinusoidal low-frequency signals $f_1$ and $g_1$. Circuit $SQ_1$ feeds a square wave $V_1$ and its complement $\overline{V_1}$ of the same low frequency to respective AND gates $P_1$, $P_2$. Depending on whether the actual carrier frequency $f_s$ is less or greater than the nominal frequency $K \cdot f_r$ of oscillator OS, circuit $SQ_2$ generates a square wave $V_2$ or $V_2'$ derived from signal $g_1$. As described hereinafter with reference to FIG. 4A, square waves $V_2$, $V_2'$ respectively lag and lead the square wave $V_1$ by 90°.

A differentiating circuit DR downstream of squarer $SQ_2$ converts wave $V_2$ (or $V_2'$) into a pulse sequence $I_2$ (or $I_2'$), synchronized with the rising flanks of wave $V_2$ (or $V_2'$), which is fed to gates $P_1$, $P_2$ for transmitting logical products $\overline{V_1} \cdot I_2$ and $V_1 \cdot I_2$ (or $V_1 \cdot I_2'$ and $\overline{V_1} \cdot I_2'$) to respective monoflops $MV_1$ and $MV_2$. These monoflops are triggered by the logical-product outputs of gates $P_1$, $P_2$ to emit rectangular waves $Q_1$, $Q_2$ (or $Q_1'$, $Q_2'$) to a pair of low-pass filters $F_3$, $F_4$ serving to average their amplitudes over time and to feed the resulting mean voltages to a differential amplifier DF for generating the control signal $V_c$ as the difference thereof; the response threshold of amplifier DF must be so chosen as to prevent cancellation of the frequency modulation, if any, due to message signal $V_m$.

As described in U.S. Pat. No. 3,886,472, a rectifying diode in the output of differentiating circuit DR suppresses the negative-polarity spikes caused by (and synchronized with) the falling flanks of square wave $V_2$ (or $V_2'$). Additional capacitors (not illustrated) may be included in discriminator CA upstream of filters $F_1$, $F_2$ for removing d-c components from the output signals of the phase-comparing circuitry represented by coupler AD and mixers $MC_1$, $MC_2$. Two grounded phantom resistors $R'$ and $R''$ shown in FIG. 1, forming a high-resistance discharge path for capacitors $C_1$ and $C_2$, symbolize the combination of the leakage resistances of these capacitors (in series with resistors $R_1$ and $R_2$), the reverse resistances of diodes $D_1$, $D_2$ and the input impedances of deviation detector CA. Each pulse of train $f_r$ charges the two capacitors to a level substantially higher than the level of the pilot oscillations present on outputs a and b, these charges leaking off slowly during the intervals between successive pulses at a rate determined by the time constants $R'C_1$ and $R''C_2$. Thus there appear at points d and e a pair of sawtooth voltages upon which the pilot oscillations developed across resistors $R_1$ and $R_2$ are superimposed with a mean level depending on the momentary amplitudes of these oscillations and therefore on their phases at the instants of occurrence of the timing pulses of train $f_r$.

Figure 3:
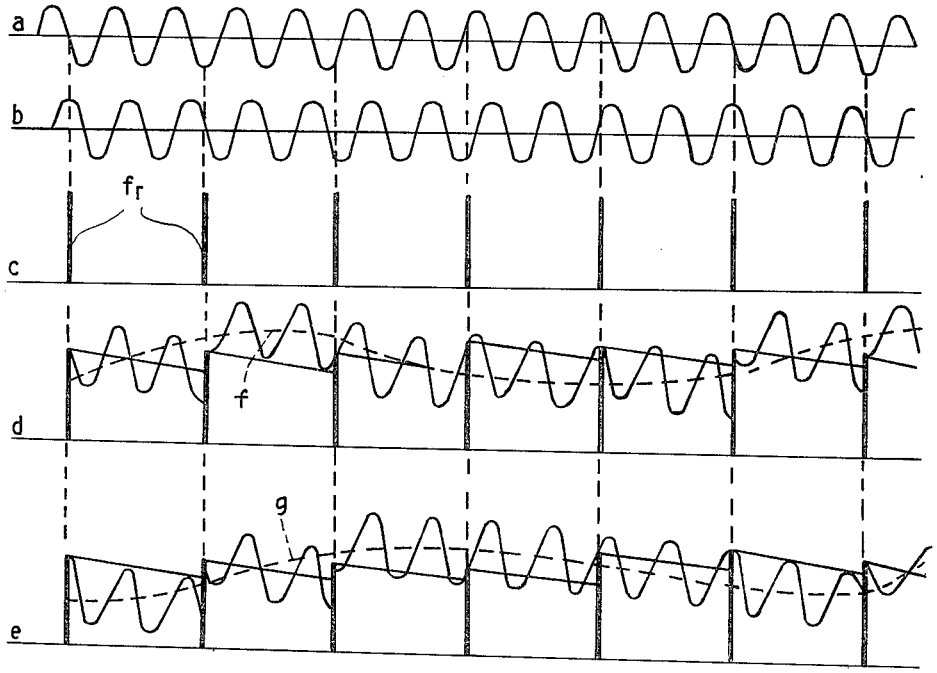
FIG. 3 is a set of graphs illustrating voltages present at correspondingly designated points in the system of FIG. 1 during operation thereof in the frequency-correcting mode.

This has been illustrated in FIG. 3 where graphs a and b show the two pilot oscillations in quadrature with each other; graph c depicts the pulse train $f_r$ obtained from unit GI and graphs d, e illustrate the composite waves fed to the zero-frequency discriminator CA of FIG. 2. These waves have generally sinusoidal low-frequency components constituting error signals f, g whose frequencies are proportional to the magnitude of the difference between the actual oscillator frequency $f_s$ and the nominal frequency $K \cdot f_r$, i.e. to the beat frequency $|f_s - K \cdot f_r|$. In the illustrated example, it is assumed that $K \cdot f_r < f_s$, i.e. that the spacing of consecutive pulses of train $f_r$ exceeds a whole number of oscillator cycles by a minor fraction of a cycle whereby signal f leads signal g by substantially 90°. With $K \cdot f_r > f_s$, the phase relationship would be reversed. The phase relationship exists also between the filtered-out error signals $f_1$ and $g_1$, as well as between square waves $V_1$ and $V_2$ (or $V_2'$), as will be seen from the corresponding graphs of FIG. 4A. This Figure also shows the spikes $I_2$ and $I_2'$, the output signals $V_1 \cdot I_2$, $V_1 \cdot I_2'$ and $\overline{V_1} \cdot I_2$, $\overline{V_1} \cdot I_2'$ of AND gates $P_1$ and $P_2$, and the resulting signals $Q_1$, $Q_1'$ and $Q_2$, $Q_2'$ respectively emitted by monoflops $MV_1$ and $MV_2$. These monoflops should be designed to emit pulses having a duration less than the reciprocal of the maximum oscillator drift $f_r/2$, whereby even the highest beat frequency extractable from voltages d, e will result in a rectangular wave at their outputs.

If operating frequency $f_s$ is greater than the nominal frequency $K \cdot f_r$, according to the illustrated phase relationship of error signals $f_1$ and $g_1$, differentiator DR generates spikes $I_2$ coinciding with high levels of square waves $V_1$ so that gate $P_1$ conducts and monoflop $MV_1$ emits pulses $Q_1$ whereby filter $F_3$ energizes the upper input of differential amplifier DF to produce a control voltage $V_c$ of one polarity. In the opposite case, spikes $I_2'$ and pulses $Q_2'$ come into existence to generate a control voltage of the other polarity as gate P$_2$ conducts and triggers the monoflop MV$_2$.

While FIG. 3 shows the pilot oscillations a, b as having a common frequency between two and three times the pulse cadence f$_r$ shown in graph c, the nominal frequency K·f$_r$ may in practice lie between 10 and 40 times that cadence, i.e. in the range of 2,000–8,000 MHz. The system specifically described, having a reference frequency equal to 200 MHz, can thus be used to stabilize oscillator frequencies of 2,000, 2,200, 2,400 ... 8,000 MHz.

Figure 4B:
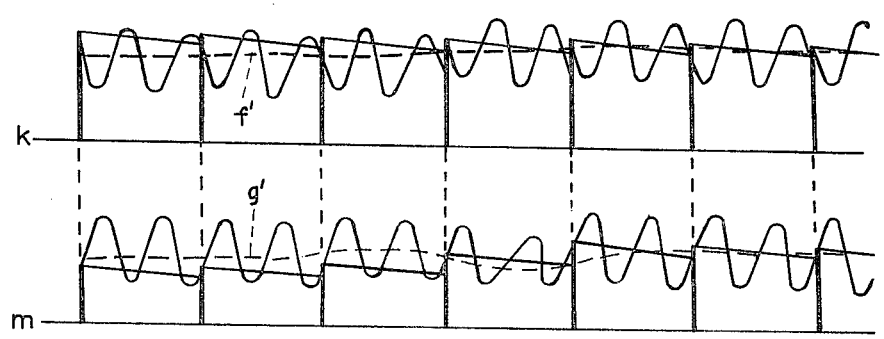
FIG. 4B is a pair of graphs relating to the operation of the system of FIG. 1 in the phase-locking mode.

If no frequency-modulating signal V$_m$ used, the two pilot oscillations a, b may be relatively phase-shifted by 180° while the deviation detector is simplified by the omission of all the components upstream of filters F$_3$, F$_4$ in FIG. 2. The output signals of mixers MC$_1$, MC$_2$, shown in graphs k, m of FIG. 4B, have the same average values f', g' when the timing pulses f$_r$ (FIGS. 1 and 3) coincide with instants close to the zero crossings of pilot oscillations a, b. In responding to a beginning divergence of these values, the system will lock the oscillator OS to reference generator GI in phase as well as in frequency.

Harmonics of the reference frequency f$_r$ may overlie the oscillator waveform f$_s$ at the output of the coupler AD extending to the load. However, owing to the large separation between pulse cadence f$_r$ and operating frequency f$_s$, the higher harmonics lying in the frequency range of the carrier are greatly attenuated and generally need not be filtered out.

It has already been proposed to sample a single pilot oscillation with two sets of pulses of opposite polarities. A sampler of this general type is known as model 5257A available from Hewlett-Packard Co.

I claim:

1. A system for producing a microwave oscillation of stabilized frequency, comprising:
    a reference generator emitting a sequence of timing pulses of constant cadence f$_r$;
    a voltage-controlled oscillator generating the microwave oscillation to be stabilized, said oscillator having an operating frequency f$_s$ deviating in a free-running state by less than f$_r$/2 from a nominal frequency equal to K·f$_r$ where K is an integer greater than 1;
    phase-comparison means with two circuit branches connected to said oscillator for deriving a pair of instantaneous amplitude samples of predetermined phase relationship from said microwave oscillation in nonconsecutive cycles thereof in the presence of each of said timing pulses and for extracting two low-frequency error signals from changes in the magnitudes of successive pairs of amplitude samples thus derived; and
    deviation-detecting means including a differential amplifier with inputs connected to said circuit branches for converting differences between said error signals into a control voltage fed to said oscillator for modifying said operating frequency f$_s$.

2. A system as defined in claim 1 wherein said phase-comparison means comprises a coupler deriving a pair of relatively phase-shifted pilot oscillations of said frequency f$_s$ from said microwave oscillation, said branches being part of a sampling circuit connected to said coupler and to said reference generator for superimposing said pilot oscillations upon two sawtooth voltages obtained from said timing pulses.

3. A system as defined in claim 2 wherein said sampling circuit comprises a pair of resistors connected across respective outputs of said coupler, each of said resistors being connected across an output of said reference generator in series with a respective blocking capacitor and a respective diode.

4. A system as defined in claim 2 or 3 wherein said pilot oscillations are in quadrature with each other, said differential amplifier being part of a zero-frequency discriminator.

5. A system as defined in claim 4 wherein said differential amplifier has a response threshold sufficient to enable limited frequency modulation of said microwave oscillation by a message signal fed to said microwave oscillator.

6. A system as defined in claim 2 or 3 wherein said pilot oscillations are in mutual phase opposition, said deviation-detecting means comprising a pair of low-pass filters connected to the inputs of said differential amplifier.

7. A system as defined in claim 1, 2 or 3 wherein said reference generator comprises a crystal-controlled oscillator operating at a frequency close to 100 MHz and a frequency doubler coupled to said crystal-controlled oscillator for establishing said cadence f$_r$ at a value close to 200 MHz.

* * * * *